(12) United States Patent
Fang et al.

(10) Patent No.: US 9,477,271 B2
(45) Date of Patent: Oct. 25, 2016

(54) TOUCH PANEL AND MANUFACTURING METHOD THEREOF

(71) Applicant: TPK Touch Solutions (Xiamen) Inc., Xiamen (CN)

(72) Inventors: Fang Fang, Xiamen (CN); Chunyan Wu, Sanming (CN); Ho-Hsun Chi, Hsinchu (TW)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 303 days.

(21) Appl. No.: 14/052,781

(22) Filed: Oct. 14, 2013

(65) Prior Publication Data

US 2014/0104509 A1    Apr. 17, 2014

(30) Foreign Application Priority Data

Oct. 15, 2012   (CN) .......................... 2012 1 0391564

(51) Int. Cl.

| | |
|---|---|
| *G06F 3/041* | (2006.01) |
| *G06F 1/16* | (2006.01) |
| *H05K 3/30* | (2006.01) |
| *G06F 3/044* | (2006.01) |
| *H05K 1/18* | (2006.01) |
| *H05K 3/32* | (2006.01) |

(52) U.S. Cl.
CPC .............. *G06F 1/169* (2013.01); *G06F 3/044* (2013.01); *H05K 3/30* (2013.01); *G06F 2203/04103* (2013.01); *H05K 1/189* (2013.01); *H05K 3/321* (2013.01); *H05K 2201/10121* (2013.01); *H05K 2201/10151* (2013.01); *H05K 2201/10977* (2013.01); *Y10T 29/49155* (2015.01)

(58) Field of Classification Search
CPC .. G06F 3/04865; G06F 3/0487; G06F 3/044; G06F 3/04875; G06F 3/045
USPC ..................... 345/173–179; 178/18.01–18.04
See application file for complete search history.

(56) References Cited

U.S. PATENT DOCUMENTS

| | | | |
|---|---|---|---|
| 8,988,395 B2* | 3/2015 | Soo ....................... | G06F 3/0416 178/18.01 |
| 2002/0089492 A1* | 7/2002 | Ahn .................... | G02F 1/13338 345/173 |
| 2012/0193210 A1* | 8/2012 | Yau ......................... | G06F 3/044 200/600 |

FOREIGN PATENT DOCUMENTS

| | | |
|---|---|---|
| CN | 101910984 A | 12/2010 |
| TW | 201003480 A | 1/2010 |
| TW | M397556 U | 2/2011 |

* cited by examiner

*Primary Examiner* — Kimnhung Nguyen
(74) *Attorney, Agent, or Firm* — Hauptman Ham, LLP

(57) ABSTRACT

The present invention provides a touch panel including a touch sensor and a connecting board. The touch sensor includes a touch substrate and a sensing electrode matrix with a plurality of connecting ends. The sensing electrode matrix is formed on the touch substrate, wherein the connecting ends of the sensing electrode matrix are separately located at at least two sides of the sensing electrode matrix. The connecting board is connected to the touch sensor, and the conducting wires in the connecting board are electrically connected to the connecting ends of the sensing electrode matrix. Furthermore, a touch panel manufacturing method is also provided.

22 Claims, 9 Drawing Sheets

TOUCH PANEL AND MANUFACTURING METHOD THEREOF

BACKGROUND OF THE INVENTION

All related applications are incorporated by reference. The present application is based on, and claims priority from, China Application Serial Number No. 201210391564.3, filed on Oct. 15, 2012, the disclosure of which is hereby incorporated by reference herein in its entirety.

1. Field of the Invention

The present disclosure relates to an input device and, in particular, to a touch panel and the manufacturing method thereof.

2. Description of the Prior Art

In recent years, touch panels have been used as a new generational of input devices. As an input device, the touch panel is the most simple, convenient and natural human-computer interaction device. Touch panels have been widely used indifferent electronic products, such as game consoles, smart phones, tablets, PCs, and soon; wherein these electronic products are generally formed by integrating a touch panel and a display screen. Through functional icons showing on the display screen, users are allowed to touch the touch panel to input signals without using any other input devices (such as buttons, keyboards or levers), thereby significantly increasing the inputting convenience.

A touch panel usually includes a touch substrate, a sensing electrode matrix formed on the touch substrate through a photolithography process, insulating layers, conducting wires, protective layers and others components. However, a photomask is used during the photolithography process, and since different touch panels may have different specifications, such as sizes, reserved edge widths, layouts of the conductive wires, so the photomask can not be reused and needs to be redesigned when manufacturing touch panels with different specifications. Moreover, because of the difference of size between the photomasks, the production line needs to be changed frequently when manufacturing different touch panels, which not only influences the yield and productivity, but also wastes a lot of manpower, financial and material resources.

SUMMARY OF THE DISCLOSURE

The present invention improves the structure of the touch panel by forming only the patterned sensing electrode matrix on the touch substrate, while the other customized components, such as conducting wires, will not be formed on the same touch substrate. Thereby, even adapting single standard specification of the template and process in patterning process, the touch panels with different specifications still could be produced.

According to one embodiment of the present invention, the present invention provides a touch panel including a touch sensor and a connecting board. The touch sensor includes a touch substrate and a sensing electrode matrix with a plurality of connecting ends. The sensing electrode matrix is formed on the touch substrate, wherein the plurality of the connecting ends of the sensing electrode matrix are separately located at at least two sides of the sensing electrode matrix. The connecting board is connected to the touch sensor, and the conducting wires in the connecting board are electrically connected to the connecting ends of the sensing electrode matrix. Furthermore, a touch panel manufacturing method is also provided.

In one embodiment of the present invention, the sensing electrode matrix is aligned with the edge of the touch substrate.

In one embodiment of the present invention, the sensing electrode matrix further comprises a plurality of conductive units, and the area of each of the conductive unit disposed on the edge of the touch substrate is half of that of each of the conductive unit disposed on the center of the touch substrate, wherein a part of the half-size conductive units are assigned to be the connecting ends.

In one embodiment of the present invention, the connecting board is a flexible printed circuit board, and the flexible printed circuit board is partially overlapped and electrically connected with the touch sensor.

In one embodiment of the present invention, the flexible printed circuit board is electrically connected to the touch sensor through an anisotropic conductive adhesive so as to allow the conducting wires of the flexible printed circuit board to be electrically connected to the sensing electrode matrix of the touch sensor through the anisotropic conductive adhesive.

In one embodiment of the present invention, the present invention further comprises a protective glue disposed on the interface of the touch sensor and the flexible printed circuit board.

In one embodiment of the present invention, the present invention further comprises a protective layer covering the edge of the touch substrate.

In one embodiment of the present invention, the present invention further comprises a cover lens attached to the touch sensor and the flexible printed circuit board with an optical glue, and the touch panel comprises a visible region and a non-visible region surrounding the visible region, wherein the area of the non-visible region is big enough to hide the flexible printed circuit board.

In one embodiment of the present invention, the present invention further comprises a shading layer disposed on the upper surface or the lower surface of the cover lens to define the non-visible region.

In one embodiment of the present invention, wherein the connecting board is a cover lens, the touch panel comprises a visible region and a non-visible region surrounding the visible region, and the conducting wires are disposed within the non-visible region.

In one embodiment of the present invention, the present invention further comprises a shading layer disposed on the upper surface or the lower surface of the cover lens to define the non-visible region.

In one embodiment of the present invention, the conducting wires are printed with silver sol to electrically connect to the sensing electrode matrix of the touch sensor.

In one embodiment of the present invention, the visible region of the cover lens is connected to the touch sensor with an optical glue.

The present invention further provides a manufacturing process for forming the touch panel comprising the following steps: first, a touch sensor including a touch substrate and a sensing electrode matrix is formed, wherein the sensing electrode matrix is formed on the surface of the touch substrate and the plurality of connecting ends are separately disposed at at least two sides of the sensing electrode matrix, and the touch sensor is connected to a connecting board with conducting wires disposed thereon, so as to electrically connect the conducting wires to the sensing electrode matrix.

In one embodiment of the present invention, the method for forming the touch sensor comprises:

forming a transparent conductive layer on at least one surface of a main substrate;
patterning the transparent conductive layer to form the patterns of the sensing electrode matrix; and dicing the main substrate to form a plurality of touch sensors.

In one embodiment of the present invention, the sensing electrode matrix is aligned with the edge of the touch substrate.

In one embodiment of the present invention, the sensing electrode matrix further comprises a plurality of conductive units, and each of the conductive units disposed on the edge of the touch substrate has half the area of each of the conductive units disposed at the center of the touch substrate, wherein a part of the half-size conductive units are assigned to be the connecting ends.

In one embodiment of the present invention, the connecting board is a flexible printed circuit board, and the flexible printed circuit board is partially overlapped and electrically connected with the touch sensor.

In one embodiment of the present invention, the flexible printed circuit board is electrically connected to the touch sensor through an anisotropic conductive adhesive.

In one embodiment of the present invention, the present invention further comprises forming a protective glue disposed on the interface of the touch sensor and the flexible printed circuit board.

In one embodiment of the present invention, the present invention further comprises forming a protective layer to cover the edge of the touch substrate.

In one embodiment of the present invention, the present invention further comprises attaching a cover lens to the touch sensor and the flexible printed circuit board with an optical glue, and the touch panel comprises a visible region and a non-visible region surrounding the visible region, wherein the area of the non-visible region is big enough so as to hide the flexible printed circuit board.

In one embodiment of the present invention, the connecting board is a cover lens, and the touch panel comprises a visible region and a non-visible region surrounding the visible region, and the conducting wires are disposed within the non-visible region.

In one embodiment of the present invention, the conducting wires are printed with silver sol.

In one embodiment of the present invention, the visible region of the touch substrate is connected to the touch sensor with an optical glue.

In the present invention, the customized conducting wires which are transferred to the connecting board are electrically connected to the connecting ends of the sensing electrode matrix, so there is no necessary to reserve an extra space in the periphery region of the touch substrate to accommodate the conducting wires. Only the sensing electrode matrix (formed through processes such as photo-etching processes or printing processes) needs to be formed on the touch substrate. Therefore, during the manufacturing process of the touch sensor, the same pattern template (such as a photomask) and the same manufacturing process can be used. After forming numerous non-customized touch sensors, each touch sensor is then connected to the customized connecting board to form different touch panels, which greatly improves the production efficiency and yield, while saving a lot of manpower, financial and material resources.

These and other objectives of the present invention will no doubt become obvious to those of ordinary skill in the art after reading the following detailed description of the preferred embodiment that is illustrated in the various figures and drawings.

DETAILED DESCRIPTION OF THE EMBODIMENTS

Figure 1:
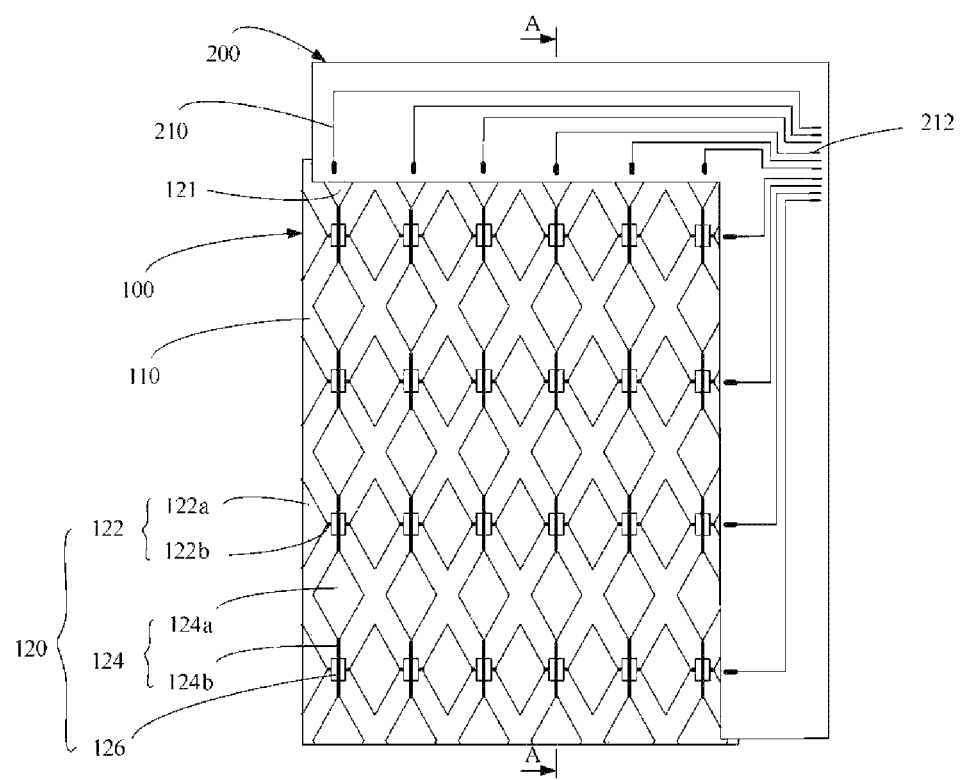
FIG. 1 is a top view diagram showing a touch panel according to a first preferred embodiment of the present invention.

Please refer to FIG. 1, a touch panel comprises a touch sensor 100 and a connecting board 200 connected to the touch sensor 100.

The touch sensor 100 includes a touch substrate 110 and a sensing electrode matrix 120 with a plurality of connecting ends, the sensing electrode matrix 120 is formed on the surface of the touch substrate 110, and the connecting ends of the sensing electrode matrix 120 are separately located at at least two sides of the sensing electrode matrix 120. The connecting ends of the sensing electrode matrix 120 are the terminal ends of the sensing electrode matrix 120 that receive the driving signals which drive the sensing electrode matrix 120, or that output the touch signals from the sensing electrode matrix; for example, the component labeled as 121 in FIG. 1 is one of the connecting ends. Usually, the sensing electrode matrix 120 is arranged in a square-shaped pattern, and the connecting ends are separately disposed at at least two sides of the sensing electrode matrix 120.

A connecting board 200 with conducting wires 210 disposed thereon is connected to the touch sensor 100, and the connecting ends of the sensing electrode matrix 120 is electrically connected to the conducting wires 210. The conducting wires 210 include an external connection line interface 212, through the external connection line interface 212, the conducting wires 210 receive the driving signal from a controller (not shown) in order to drive the sensing electrode matrix 120; also the external connection line interface 212 can send the touch signal from the sensing electrode matrix 120 to the controller in order to identify touch location.

In the present invention, the conducting wires 210 are customized to electrically connect with the connecting ends of the sensing electrode matrix 120, and the disposition of the customized conducting wires 210 is transferred to the connecting board 200 from the conventional touch substrate. Thereby, the periphery region of the touch substrate 110 does not need to reserve an extra space for the disposition of the conducting wires 210, only the sensing electrode matrix 120 (which may be formed through a photo-etching process or a printing process) needs to be formed on the touch substrate 110. Therefore, during the manufacturing process of the touch sensor 100, the same pattern (such as a photomask) and the same manufacturing process can be used to form numerous non-customized touch sensors. After the non-customized touch sensors are formed, each touch sensor 100 is then connected to the customized connecting board 200. In this way, the production efficiency and yield are greatly improved, thereby saving a lot of manpower, financial and material resources.

As shown in FIG. 1, the sensing electrode matrix 120 includes a plurality of first axial electrodes 122 which are parallel to each other, a plurality of second axial electrodes 124 which are parallel to each other and a plurality of insulating blocks 126. The first axial electrodes 122 and the second axial electrodes 124 are electrically isolated from each other through the insulating blocks 126. The first axial electrodes 122 further comprise a plurality of first conductive units 122a and a plurality of first conducting lines 122b which are disposed on the touch substrate 110. The insulating blocks 126 are disposed on the first conducting lines 122b. The second axial electrodes 124 further comprise a plurality of second conductive units 124a disposed on the touch substrate 110 and a plurality of second conducting lines 124b disposed on the insulating blocks 126. The sensing electrode matrix 120 mentioned above can be formed with a same photomask, therefore, each sensing electrode matrix 120 formed on the touch substrate 110 has common specifications.

In the embodiment shown in FIG. 1, the sensing electrode matrix 120 is aligned with the edge of the touch substrate 110, such that the first conductive unit 122a is aligned with the edge of the touch substrate 110. In this situation, the first conductive units 122a which are disposed on the edge of the touch substrate 110 are the connecting ends of the sensing electrode matrix 120. The sensing electrode matrix 120 is aligned with the edge of the touch substrate 110 to improve the space utilization of the touch substrate 110. In another embodiment, there may be a certain reserved width between the edge of the sensing electrode matrix 120 and the edge of the touch substrate 110.

As shown in FIG. 1, the first conductive units 122a and the second conductive units 124a (hereinafter collectively referred as conductive units) disposed at the center of the touch substrate 110 are diamond-shaped, and the conductive units disposed on the edge of the touch substrate 110 are only a half of the diamond shape remains which is cut from the diagonal of the diamond-shaped conductive units; in other words, each conductive unit disposed on the edge of the touch substrate 110 has half the area of each conductive unit disposed on the center of the touch substrate 110, and the half of the diamond-shaped conductive units are used as the connecting ends of the sensing electrode matrix 120. Apart from the diamond shape, the conductive units can also be rectangular shaped, hexagonal shaped or other shapes. Since each of the conductive units disposed on the edge of the touch substrate 110 has half of the area of each conductive unit disposed on the center of the touch substrate 110, the touch sensor 100 may be formed by a cutting process. Each separate touch substrate 110 after cutting has enough space (such as in the peripheral area of the touch substrate) to accommodate the connecting end of the sensing electrode matrix 120. The method of cutting has been described in the below paragraphs.

Figure 2:
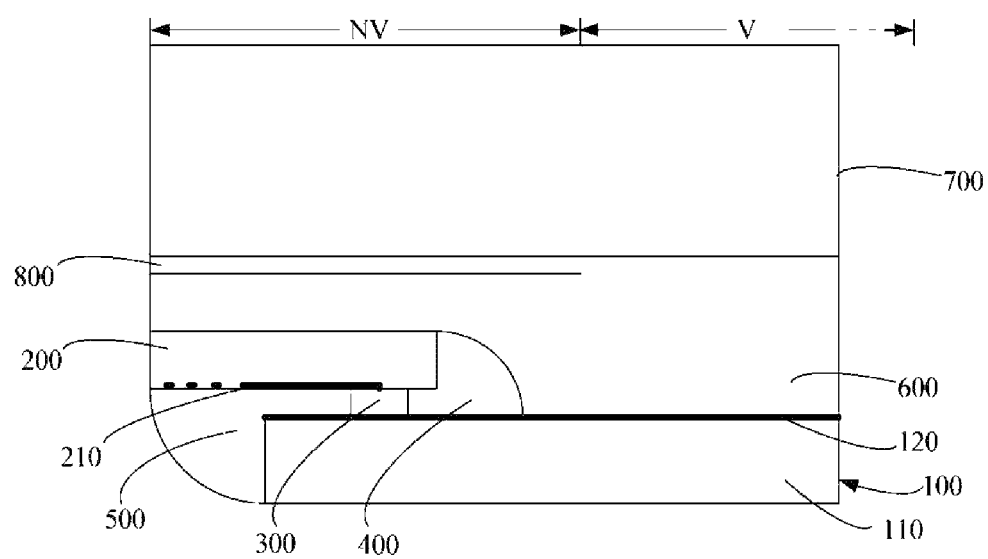
FIG. 2 is a cross sectional diagram taken along the section line A-A' of FIG. 1.

Please refer to FIG. 1 again and cooperatively refer to FIG. 2. In this embodiment, the connecting board 200, such as a flexible printed circuit board, is partially overlapped with the touch sensor 100. Since the connecting board 200 and the touch sensor 100 are not disposed on a same level, the contact area can be adjusted according to the actual requirements. In this embodiment, the connecting board 200 and the touch sensor 100 are bonded with each other to electrically connect the conducting wires 210 of the connecting board 200 and the sensing electrode matrix 120 of the touch sensor 100 through an anisotropic conductive adhesive 300. Apart from the anisotropic conductive adhesive 300, other connecting material, such as solders, can be used to connect the connecting board 200 and the touch sensor 100.

To avoid electro-static discharge (ESD) occurring in the bonding interface between the touch sensor 100 and the connecting board 200, a protective glue 400 can be formed in the bonding interface between the surface of the touch sensor 100 and the connecting board 200. The protective glue 400 may be filled into the bonding interface between the surface of the touch substrate 110 and the connecting board 200 to avoid damages from the electro-static discharge.

In addition, to protect the exposed conductive units disposed on the edge of the touch substrate 110, and to avoid the influence of leakage currents or electrostatic effects, a protective film 500 may further cover the edge of the touch substrate 110 or the edge of the touch sensor 100. The protective film 500 may have a same material as the protective glue 400, such as a resin. A frame glue or a rupture membrane can also be used to form the protective film 500.

In order to further protect the sensing electrode matrix 120 disposed on the touch substrate 110, the touch panel mentioned above may further comprise a cover lens 700 (such as a cover glass) attached to the touch sensor 100 and the connecting board 200 through an optical glue 600. The optical glue 600 may be hydrogel or OCA (Optical Clear Adhesive, a particular optically transparent double-sided adhesive) or others suitable adhesive materials.

Moreover, the touch panel includes a visible region V and a non-visible region NV surrounding the visible region V, and a shading layer 800 is used to define the range of the non-visible region NV and is disposed on the upper surface or the lower surface of the cover lens 700. In this embodiment, the shading layer 800 is disposed on the lower surface of the cover lens 700. The shading layer 800 is used to hide the connecting board 200 or others components within the non-visible region NV. The material of the shading layer 800 may be ink, photoresist or other suitable materials.

The embodiment mentioned above may further comprise a protective layer (not shown) disposed on the sensing electrode matrix 120, such as a silicide layer, to protect the sensing electrode matrix 120 while the cover lens 700 is attached on the protective layer and the connecting board 200 through the optical glue 600.

Figure 3:
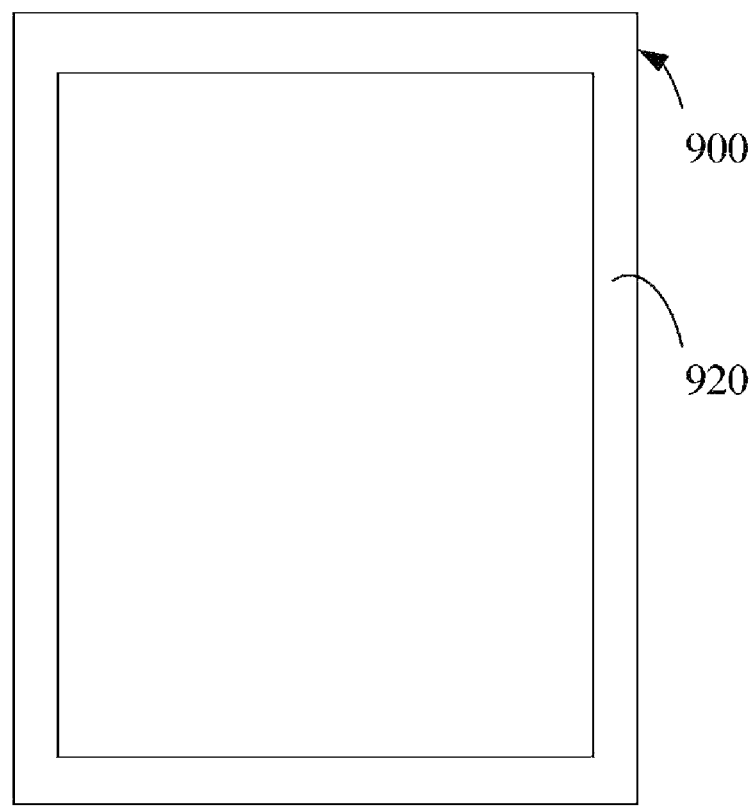
FIG. 3 is a top view diagram showing a touch panel according to the first preferred embodiment of the present invention.
Figure 4:
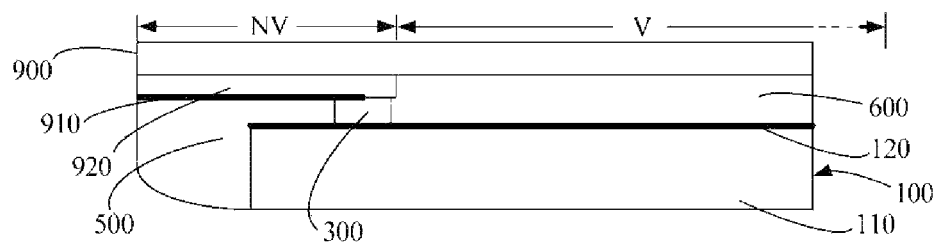
FIG. 4 is a cross sectional diagram showing a touch panel according to the first preferred embodiment of the present invention.

The embodiment mentioned above uses a flexible printed circuit board as the connecting board 200. In addition, please refer to FIG. 3 and FIG. 4. In the present embodiment, a cover lens 900 (such as a cover glass) is used as the connecting board; in other words, a plurality of conducting wires 910 is disposed on the cover lens 900 directly. Besides, as shown in FIG. 3 and FIG. 4, since the touch panel comprises the visible region V and the non-visible region NV surrounding the visible region V, therefore the conducting wires 910 are disposed within the non-visible region NV of the cover lens 900, and the touch panel further comprises a shading layer 920 disposed on the lower surface or the upper surface of the cover lens 900 to define the non-visible region NV. Therefore, the conducting wires 910 are disposed on the lower surface of the shading layer 920 when the shading layer 920 is disposed on the lower surface of the cover lens 900. In another embodiment, the shading layer 920 may be disposed on the upper surface of the cover lens 900, and the conducting wires 910 are disposed on the lower surface of the cover lens 900 corresponding to the non-visible region NV.

The conducting wires 910 are disposed on the periphery region of the cover lens 900, the visible region V of the cover lens 900 is bonded with the touch sensor 100 through the optical glue 600, and the conducting wires 910 within the non-visible region NV are electrically connected to the connecting ends of the sensing electrode matrix 120 of the touch sensor 100 through the anisotropic conductive adhesive 300. In this embodiment, the cover lens 900 is used as the connecting board in order to further simplify the structure of the touch panel.

Apart from using the anisotropic conductive adhesive 300 to electrically connect the conducting wires 910 with the sensing electrode matrix 120, in another embodiment, a surface mounted technology can be performed to electrically connect the cover lens 900 with the touch sensor 100. In more detail, the conducting wires 910 can be made of silver sol, so that during the mounting process for connecting the cover lens 900 to the touch substrate 110 of the touch sensor 100, the conducting wires 910 which are made of silver sol can be attached to and electrically connected to the sensing electrode matrix 120 formed on the touch substrate 110 in order to achieve signal transmission without the help from the anisotropic conductive adhesive 300.

In the embodiment mentioned above, a protective layer can be further formed on the sensing electrode matrix 120, such as silicide layer, to protect the sensing electrode matrix 120, while the visible region V of the cover lens 900 is attached on the protective layer with the optical glue 600.

Besides, even though the cover lens 900 can protect the front side of the sensing electrode matrix 120 by attaching the cover lens 900 onto the sensing electrode matrix 120, the conductive units disposed on the edge of the touch substrate 110 are still exposed. A protective film 500 may further cover the edge(s) of the touch substrate 110 or the edge(s) of the touch sensor 100. The material of the protective film 500 can be frame glue or rupture membrane.

In order to achieve the purpose of using uniform pattern template and manufacturing processes for different specifications of touch panels, the manufacturing method of the touch panel needs to be improved. Please refer to FIG. 5, which shows the manufacturing process of the touch panel. The method is based on the touch panel structure shown in FIGS. 1-2, and comprises the following steps:

Step S510: the touch sensor 100 including the touch substrate 110 and the sensing electrode matrix 120 with a plurality of connecting ends is formed, wherein the sensing electrode matrix 120 is formed on the surface of the touch substrate 110, and the connecting ends are separately located at at least two sides of the sensing electrode matrix. The connecting ends of the sensing electrode matrix 120 are the terminal ends of the sensing electrode matrix 120 that receive driving signals to drive the sensing electrode matrix 120, or output the signals from the sensing electrode matrix 120. For example, the component labeled as 121 in FIG. 1 is one of the connecting ends. Usually, the sensing electrode matrix 120 is square-shaped, and the connecting ends are separately disposed at at least two sides of the sensing electrode matrix 120.

Step S520: the touch sensor 100 is connected to a connecting board 200 which is laid conducting wires 210 thereon so as to allow the connecting ends of the sensing electrode matrix 120 to be electrically connected to the conducting wires 210.

The manufacturing method of the touch panel mentioned above needs customized conducting wires 210 which are transferred to the connecting board 200 to electrically connect to the separated connecting ends located at at least two sides of the sensing electrode matrix 120, so that there is no necessary to reserve an extra space in the periphery region of the touch substrate 110 for accommodating the conducting wires. Only the sensing electrode matrix 120 (which may be formed through a photo-etching process or a printing process) needs to be formed on the touch substrate 110. Therefore, during the manufacturing process of the touch sensor 100, the same pattern template (such as a photomask) and the same manufacturing process can be used to form numerous touch sensors. After the non-customized touch sensors 110 are formed, and each touch sensor 100 is then connected to the customized connecting board 200, the touch panels with different specifications will be made accordingly, thereby greatly improving the production efficiency and yield, and saving a lot of manpower, financial and material resources.

Figure 5:
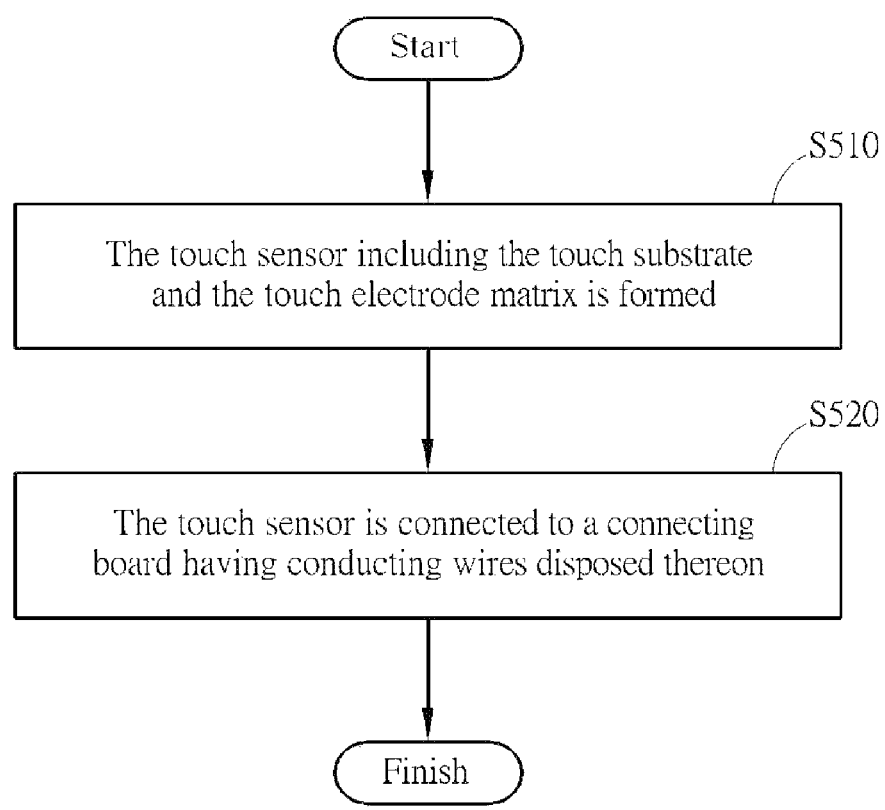
FIG. 5 is a flow diagram showing a manufacturing process of a touch panel of the present invention.

In the embodiment shown in FIG. 5, the connecting board 200, such as a flexible printed circuit board, is partially overlapped with the touch sensor 100. Through an anisotropic conductive adhesive 300, the flexible printed circuit board and the touch sensor 100 are bonded to each other so that the conducting wires 210 of the connecting board 20 and the sensing electrode matrix 120 of the touch sensor 100 are electrically connected with each other accordingly.

Figure 6:
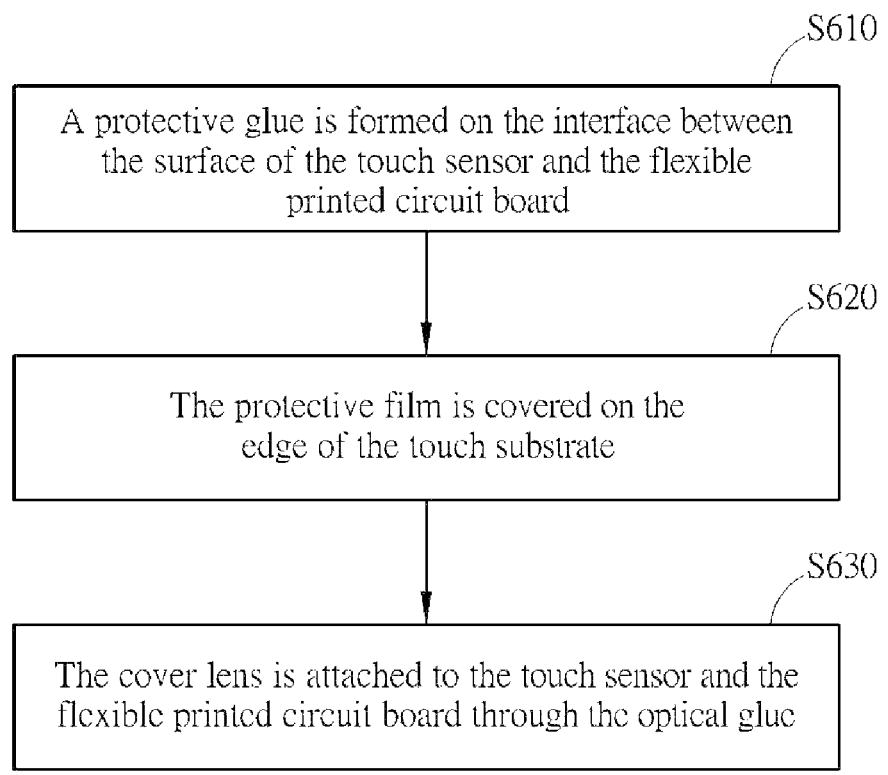
FIG. 6 is an additional process flow item for forming a touch panel according to one embodiment of the present invention.

After the flexible printed circuit board and the touch sensor 100 are connected, please refer to FIG. 6, which is based on the touch panel structure shown in FIG. 2. As shown in FIG. 6, the manufacturing method further comprises the following steps:

Step S610: A protective glue 400 is formed on the bonding interface between the surface of the touch sensor 100 and the flexible printed circuit board. In order to avoid the electrostatic discharge (ESD) that may occur on the bonding interface, the protective glue 400 may cover and filled into the bonding interface between the surface of the touch sensor 100 and the flexible printed circuit board.

Step S620: A protective film 500 is covered on the edge of the touch substrate 110, even the edge of the touch sensor 100. Through covering the protective film 500 on the edge of the touch substrate 110 or the edge of the whole touch sensor 100, the exposed conductive units disposed on the edge of the touch substrate 110 can be protected for avoiding the influence of leakage currents or electrostatic effects. The protective film 500 may be made by the same material as the protective glue 400, such as a resin, a frame glue or a rupture membrane.

Step S630: A cover lens 700 is attached to the touch sensor 100 and the flexible printed circuit board with the optical glue 600. The optical glue 600 may comprise hydrogel or OCA (Optical Clear Adhesive, a particular optically transparent double-sided adhesive) or other suitable adhesive materials. In addition, in order to achieve a better shading performance, a shading layer 800 can be disposed within the non-visible region NV on the upper surface or the lower surface of the cover lens 700. In the embodiment shown in FIG. 2, the shading layer 800 is disposed on the lower surface of the cover lens 700. The shading layer 800 is used to hide the flexible printed circuit board or others components within the non-visible region NV, so as to avoid exposing these components in the user interface In another embodiment, as shown in FIG. 3 and FIG. 4, the touch panel uses the cover lens 900 (such as a cover glass) as the connecting board, and the manufacturing method shown in FIG. 5 is described as following: Step S510, the touch sensor 100 including the touch substrate 110 and the sensing electrode matrix 120 is formed, wherein the sensing electrode matrix 120 is formed on the surface of the touch substrate 110, and the connecting ends of the sensing electrode matrix 120 are separately disposed at at least two sides of the sensing electrode matrix 120, the touch panel further comprises a shading layer 920 disposed on the lower surface of the cover lens 900 to define the non-visible region NV. In another embodiment, the shading layer 920 may be disposed on the upper surface of the cover lens 900. Step S520: the touch sensor 100 is attached to the visible region V of the cover lens 900 with the optical glue 600, and the conducting wires 910 within the non-visible region NV are connected to the connecting ends of the sensing electrode matrix 120 through the anisotropic conductive adhesive material 300.

In this embodiment, the cover lens 900 is used as the connecting board to further simplify the structure of the touch panel. The optical glue 600 may be hydrogel or OCA (Optical Clear Adhesive, a particular optically transparent double-sided adhesive) or other suitable adhesive material. Apart from using the anisotropic conductive adhesive 300 to electrically connect the conducting wires 910 and the sensing electrode matrix 120, in another embodiment, a surface mounted technology can be performed to electrically connect the cover lens 900 to the touch substrate 110. In more detail, the conducting wires 910 can be made of silver sol, so that during the mounting process for connecting the cover lens 900 and the touch substrate 110, the conducting wires 910 can be attached to and electrically connected to the sensing electrode matrix 120 on the touch substrate 110 in order to achieve signal transmission without the help from the anisotropic conductive adhesive 300.

Figure 7:
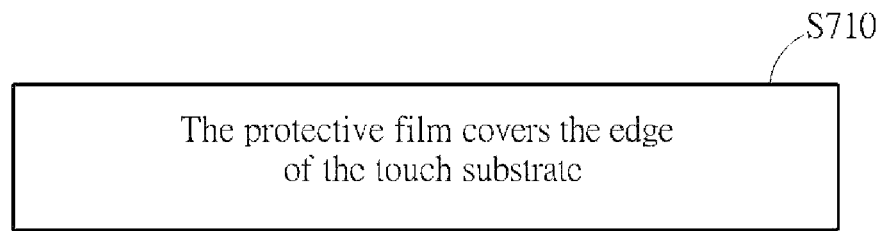
FIG. 7 is an additional process flow item for forming a touch panel according to another embodiment of the present invention.

Besides, even though the cover lens 900 can protect the front side of the sensing electrode matrix 120 by attaching the cover lens 900 onto the sensing electrode matrix 120, the conductive units disposed on the edge of the touch substrate 110 are still exposed, so the manufacturing method of the present invention may further comprise the process shown in FIG. 7.

Step S710: By covering the protective film 500 on the edge(s) of the touch substrate 110 or the edge(s) of the touch sensor 100, the influences of leakage currents or electrostatic effects can be avoided, and the protective film 500 may be the same material as the protective glue 400, such as a resin, a frame glue or a rupture membrane.

Figure 8:
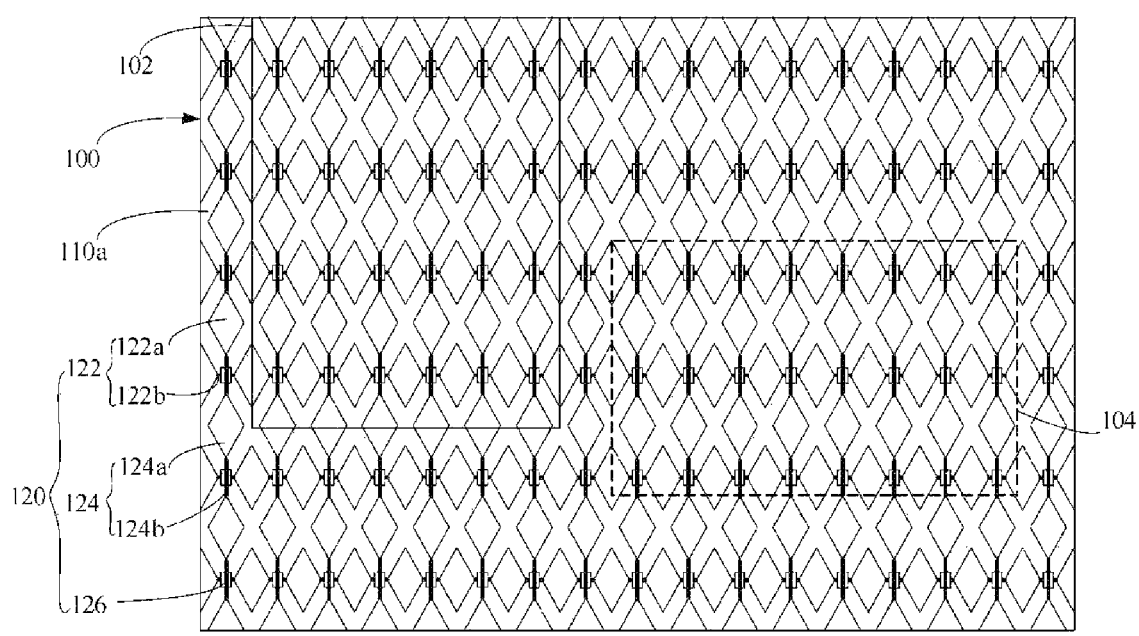
FIG. 8 is a schematic diagram showing the main substrate with touch sensors of the present invention.
Figure 9:
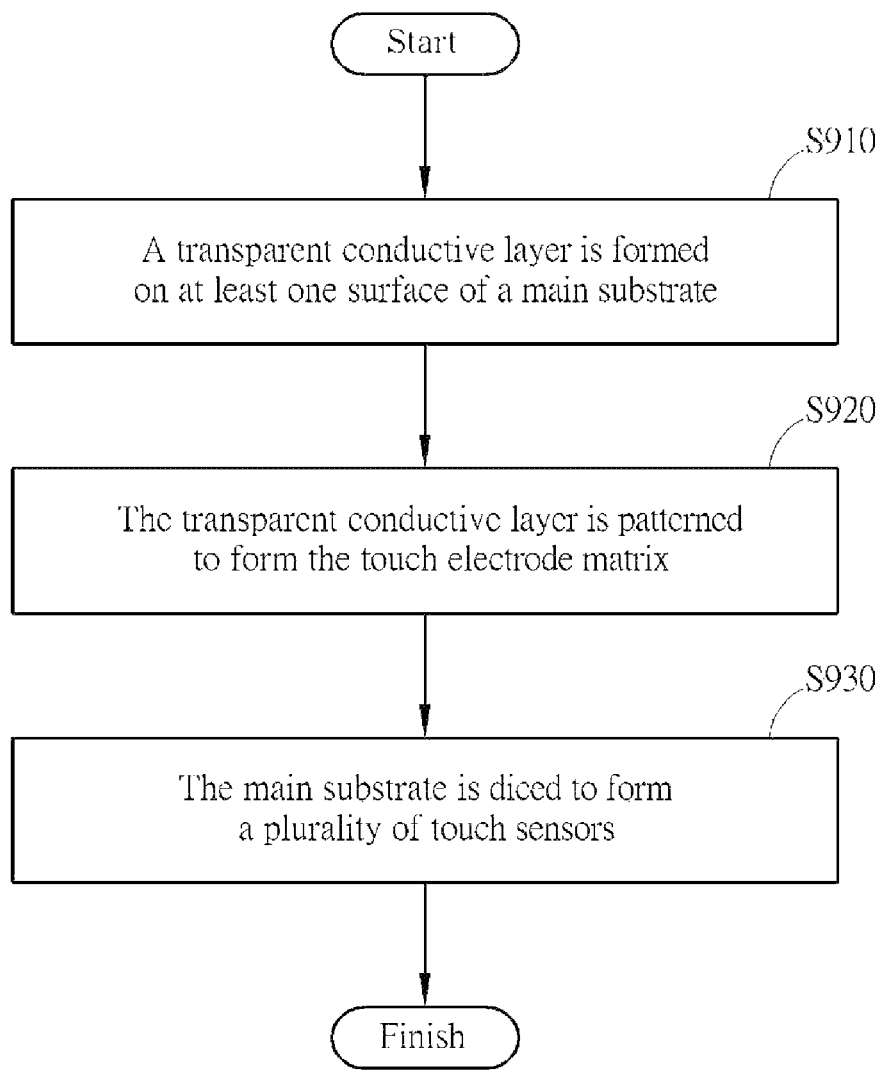
FIG. 9 is a flow diagram showing a manufacturing process for forming a touch panel with the touch sensors and the sensing electrode matrix of the present invention.

The embodiments mentioned above are focused on one touch sensor. Subsequently, in order to fully illustrate the manufacturing process for mass production of the present invention, please further refer to FIGS. 8-9, which show the process for forming the touch sensors.

Step S910: a transparent conductive layer is formed on at least one surface of a main substrate 110a, and the process is similar to the conventional processes, and will not be redundantly described here.

Step S920: the transparent conductive layer is patterned to form the sensing electrode matrix 120, such as through a photo-etching process. As the sensing electrode matrix 120 shown in FIG. 8, the sensing electrode matrix 120 includes a plurality of first axial electrodes 122 which are parallel to each other, a plurality of second axial electrodes 124 which are parallel to each other and a plurality of insulating blocks 126. The first axial electrodes 122 and the second axial electrodes 124 are electrically isolated from each other, and the insulating blocks 126 are disposed between the first axial electrodes 122 and the second axial electrodes 124. The first axial electrodes 122 further comprise a plurality of first conductive units 122a disposed on the touch substrate 110 and a plurality of first conducting lines 122b. The second axial electrodes 124 further comprise a plurality of second conductive unit 124a disposed on the touch substrate 110 and a plurality of second conducting lines 124b.

In addition, in one embodiment, the manufacturing process for forming the sensing electrode matrix 120 on the touch substrate 110 comprises: forming the first conducting lines on the touch substrate 110; and the insulating blocks 126 are then formed on the corresponding first conducting lines 124b, respectively, and all of the first conductive units 122a, the second conductive unit 124a and the second conducting lines 124b are then formed. For the first axial electrodes 122 in the same line, the first conducting lines 122b are disposed between two adjacent first conductive units 122a and connected to the two adjacent first conductive units 122a. For the second axial electrodes 124 in the same line, the two adjacent second conductive units 124a are disposed at two sides of the corresponding first conducting lines 122b, the second conducting lines 124b are disposed on the corresponding insulating blocks 126, respectively, and disposed between the two adjacent second conductive units 124a to connect with the two adjacent second conductive unit 124a. In addition, in another embodiment, the first conductive units 122a, the second conductive units 124a and the first conducting lines 122b or the second conducting lines 124b can be formed simultaneously. If the first conductive units 122a, the second conductive units 124a and the first conducting lines 122b are formed at same time, each of the first conducting lines 122b connect with the corresponding adjacent first conductive units 122a, and the corresponding insulating blocks 126 are formed on the first conducting lines 122b; each of the second conducting lines 124b are then formed on the corresponding insulating blocks 126 and connected with the corresponding adjacent second conductive units 124a.

Step S930: the main substrate 110a is cut to form a plurality of touch sensors. For example, the main substrate shown in FIG. 8 can be divided into two touch sensors—the touch sensor 102 and the touch sensor 104. The main substrate can be cut through a mechanical, a chemical or a laser process.

In this embodiment, during the process for cutting the main substrate 110a, since the patterned sensing electrode matrix 120 is formed on the whole surface of the main substrate 110a, the edge of the sensing electrode matrix 120 on the cutted sensor 102 and 104 is aligned with the edge of the cutted touch substrate 110 to facilitate the electrical connection with the conducting wires of the connecting board in the follow-up process. Besides, in this embodiment, the conductive units are diamond shaped, and the cutting line during the cutting process may be along the diagonal of the diamond-shaped conductive units, so as to maximize the area utilization of the main substrate 110a. In an ideal situation, the whole area of the main substrate 100a can be utilized. In the present invention, the cutting is not limited thereto, and the cutting line of the touch sensor 104 shown in the figure can be adjusted according to actual requirements.

In the present invention, numerous non-customized touch sensors can be formed in a standard process, therefore, the touch sensor can be connected to a connecting board with customized conducting wires, and form a customized touch panel.

It is not difficult to understand that the touch panel structure and manufacturing mentioned above are not only adapted to capacitive touch panels, any touch panel with sensing electrode array can use the touch panel structure and manufacturing methods of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A touch panel, comprising:
   a touch sensor including a touch substrate and a sensing electrode matrix with a plurality of connecting ends, wherein the sensing electrode matrix is formed on a surface of the touch substrate, and wherein connecting ends of the plurality of connecting ends are separately located at at least two sides of the sensing electrode matrix; and
   a connecting board with conducting wires disposed thereon, connected to the touch sensor, wherein the conducting wires are electrically connected to the connecting ends of the plurality of connecting ends,
   wherein the sensing electrode matrix comprises a plurality of full-size conductive units and a plurality of half-size conductive units, and the half-size conductive units are aligned with edges of the touch substrate, the full-size conductive units are disposed on a center of the touch substrate, wherein some of the half-size conductive units are assigned to be the connecting ends of the plurality of connecting ends.

2. The touch panel of claim 1, wherein the sensing electrode matrix has a plurality of sides, and the plurality of sides of the sensing electrode matrix are aligned with the edges of the touch substrate.

3. The touch panel of claim 1, wherein the connecting board is a flexible printed circuit board, and the flexible printed circuit board is partially stacked on the touch substrate, and the full-size conductive units of the sensing electrode matrix are exposed from the flexible printed circuit board.

4. The touch panel of claim 3, wherein the flexible printed circuit board is electrically connected to the touch sensor through an anisotropic conductive adhesive so as to allow the conducting wires of the flexible printed circuit board to be electrically connected to the sensing electrode matrix of the touch sensor through the anisotropic conductive adhesive.

5. The touch panel of claim 4, further comprising a protective glue filled into a gap between the touch substrate and the connecting board so as to cover a bonding interface defined by the touch substrate, the connecting board and the anisotropic conductive adhesive.

6. The touch panel of claim 1, further comprising a protective layer covering the edges of the touch substrate.

7. The touch panel of claim 1, further comprising a cover lens stacked on the touch substrate and the connecting board so as to cover the touch substrate and the connecting board, and the cover lens comprises a shading layer to define a visible region corresponding to the full-size conductive units of the sensing electrode matrix and a non-visible region covering the connecting board.

8. The touch panel of claim 7, further comprising an optical glue layer disposed between the cover lens and the touch substrate.

9. The touch panel of claim 1, wherein the connecting board is a cover lens stacked on the touch substrate so as to cover the touch substrate, the cover lens comprises a shading layer to define a visible region and a non-visible region surrounding the visible region, and the conducting wires are disposed within the non-visible region to electrically connect to the some of the half-size conductive units of the sensing electrode matrix, and the visible region corresponds to the full-size conductive units of the sensing electrode matrix.

10. The touch panel of claim 9, wherein the shading layer is disposed on the upper surface or the lower surface of the cover lens.

11. The touch panel of claim 9, wherein the conducting wires are printed with silver sol to electrically connect the sensing electrode matrix of the touch sensor.

12. The touch panel of claim 9, further comprising an optical glue layer disposed between the visible region of the cover lens and the touch substrate.

13. A manufacturing method of a touch panel, comprising:
   forming a touch sensor including a touch substrate and a sensing electrode matrix with a plurality of connecting ends, wherein the sensing electrode matrix is formed on a surface of the touch substrate, and wherein connecting ends of the plurality of connecting ends are separately disposed at at least two sides of the sensing electrode matrix; and
   connecting the touch sensor to a connecting board with conducting wires disposed thereon to electrically connect the conducting wires to the connecting ends of the plurality of connecting ends,
   wherein forming the touch sensor comprises:
   forming a transparent conductive layer on at least one surface of a main substrate;
   patterning the transparent conductive layer to form a plurality of full-size conductive units of the sensing electrode matrix; and
   dicing the main substrate to form the touch sensor, wherein the sensing electrode matrix comprises the full-size conductive units disposed on a center of the touch substrate and a plurality of half-size conductive units aligned with edges of the touch substrate, and wherein some of the half-size conductive units are performed as the connecting ends of the plurality of connecting ends.

14. The method of claim 13, wherein the sensing electrode matrix has a plurality of sides, and the plurality of sides of the sensing electrode matrix are aligned with the edges of the touch substrate.

15. The method of claim 13, wherein the connecting board is a flexible printed circuit board, and the flexible printed circuit board is partially stacked on the touch substrate, and the full-size conductive units of the sensing electrode matrix are exposed from the flexible printed circuit board, and the flexible printed circuit board is electrically connected to the touch sensor through an anisotropic conductive adhesive.

16. The method of claim 15, wherein the anisotropic conductive adhesive is disposed between the conducting wires and the some of half-size conductive units to make an electrical connection therebetween.

17. The method of claim 15, further comprising forming a protective glue filled into a gap between the touch substrate and the connecting board so as to cover a bonding interface defined by the touch substrate, the connecting board and the anisotropic conductive adhesive.

18. The method of claim 13, further comprising forming a protective layer to cover the edges of the touch substrate.

19. The method of claim 13, further comprising attaching a cover lens to the touch sensor and the connecting board so as to cover the touch substrate and the connecting board, wherein the touch panel comprises a shading layer to define a visible region corresponding to the full-size conductive units of the sensing electrode matrix and a non-visible region covering the connecting board.

20. The method of claim 13, wherein the connecting board is a cover lens stacked on the touch substrate so as to cover the touch substrate, the cover lens comprises a shading layer to define a visible region and a non-visible region surrounding the visible region, and the conducting wires are disposed within the non-visible region to electrically connect to the some of the corresponding half-size conductive units of the sensing electrode matrix, and the visible region corresponds to the full-size conductive units of the sensing electrode matrix.

21. The method of claim 20, wherein the conducting wires are printed with silver sol.

22. The method of claim 20, further comprising forming an optical glue layer disposed between the visible region of the cover lens and the touch substrate.

* * * * *